United States Patent [19]

Yamazaki et al.

[11] Patent Number: 4,962,413

[45] Date of Patent: Oct. 9, 1990

[54] ANALOG SWITCH WITH MINIMIZED NOISE ASCRIBABLE TO GATE CAPACITANCE

[75] Inventors: Seiichi Yamazaki; Hiroaki Inoue; Sumihiro Takashima; Hiroshisa Shishikura, all of Tokyo, Japan

[73] Assignee: Oki Electric Industry Co, Ltd., Tokyo, Japan

[21] Appl. No.: 230,234

[22] Filed: Aug. 9, 1988

[30] Foreign Application Priority Data

Aug. 14, 1987 [JP] Japan ................. 62-202968

[51] Int. Cl.$^5$ ............................. H01L 27/02
[52] U.S. Cl. .......................... 357/42; 357/41;
  357/23.9; 357/45; 350/333; 350/332; 350/334;
  350/335; 350/336
[58] Field of Search ............ 357/42, 23.9, 41, 45;
  350/332, 333, 334, 335, 336

[56] References Cited

U.S. PATENT DOCUMENTS 3,936,676  2/1976  Fujita ..................... 357/42 X
4,345,366  8/1982  Brower .................... 357/42 X
4,391,650  7/1983  Pfeifer et al. ............. 357/42 X

FOREIGN PATENT DOCUMENTS 61-94365  5/1986  Japan .

OTHER PUBLICATIONS

No Author, "MOS Moves onto High-Speed Track," *Electronics*, May 26, 1969, pp. 49-52.
Bower, "MOS Field Effect Transistors Formed by Gate Masked Ion Implantation," *IEEE Transactions on Electron Devices*, vol. Ed-15, No. 10, Oct. 1968, pp. 757-761.

*Primary Examiner*—William Mintel
*Attorney, Agent, or Firm*—Wenderoth, Lind & Ponack

[57] ABSTRACT

An analog switch includes n-channel and p-channel MOSFETs formed in a surface of a semiconductor substrate. Each of the n-channel and p-channel MOSFETs has first, second and third diffused regions which are formed in the semiconductor surface with the width thereof substantially equal to each other. The first and third diffused regions are spaced from the second diffused region to form first and second channel regions, respectively. Each of the n-channel and p-channel MOSFETs has first and second gate electrodes which are interconnected in common to each other and placed on respective gate insulating layers overlaying the first and second channel regions, respectively. The first gate electrode has an end portion extending over part of the second diffused region by a predetermined length, while the second gate electrode has an end portion extending over another part, opposite to the earlier-mentioned part, of the second diffused region by a predetermined length. A sample and hold circuit including the analog switch is also provided.

15 Claims, 6 Drawing Sheets

ANALOG SWITCH WITH MINIMIZED NOISE ASCRIBABLE TO GATE CAPACITANCE

BACKGROUND OF THE INVENTION

1. Field of the Invention

The present invention relates to an analog switch and, more particularly to an analog switch which is suitable for use with an active matrix liquid crystal display device, and a sample and hold circuit using the same.

2. Description of the Prior Art

Driving an active matrix liquid crystal display device by sampling and holding a color TV video signal is well known in the art and may be implemented by the combination of capacitors and analog switches or CMOS switches each having the structure of an IGFET such as an MOSFET. Specifically, analog switches individually sample, for example, a red (R), a green (G) and a blue (B) component signal of a color TV video signal to store charges associated with the color component signals R, G and B in individual capacitors. Voltages associated with the charges stored in the capacitors are read out by individual buffer amplifiers to drive the liquid crystal display device.

Analog switches available for storing charges associated with signals in capacitors include an analog switch of the type having p-channel FETs and n-channel MOSFETs the source-to-drain paths of which are connected in parallel. In this type of analog switch, either one of the source electrodes and drain electrodes of the two MOSFETs is connected to a signal output to a capacitor which is adapted to store a charge while the other is connected to a video signal input. A gate or strobe signal is coupled to gate electrodes of the FETs.

Gate capacitances are parasitic on the signal output of the analog switch and the gate electrodes of the two MOSFETs. Hence, when a gate signal is applied to the gate electrodes of the FETs, there often occurs a run-around of pulse-like noises to the signal output through the gate capacitances. The pulse-like noises which reached the signal output are opposite in polarity to each other and therefore should cancel each other because the gate signals applied to the gate electrodes of the p-channel and n-channel FETs are opposite in polarity. In the prior art analog switch, however, the gate capacitance of the p-channel FET and that of the n-channel FET are not at the same level, allowing thereby noises ascribable to the gate capacitances to appear in the output signal of the analog switch.

In the prior art analog switch, the channel width differs from the p-channel MOSFET to the n-channel MOSFET and, in addition, the length over which the gate electrode overlaps impurity diffused regions which define source and drain regions differs from one of the two FETs to the other. Hence, the gate capacitances of the two FETs are different from each other. Further, when masks for forming the diffused regions and gate electrode layers are dislocated relative to each other, the gate electrodes of the p-channel and n-channel FETs may fail to have the same overlapping length. In such a condition, even if the two FETs are supplied with the same gate signal voltage, their output signals or voltages cannot be the same as each other.

SUMMARY OF THE INVENTION

It is therefore an object of the present invention to provide an analog switch which minimizes the unbalance of gate capacitance between p-channel and n-channel MOSFETs.

It is another object of the present invention to provide a sample and hold circuit with minimized noise ascribable to gate capacitances.

In accordance with the present invention, an analog switch is provided which includes: a semiconductor substrate; and n-channel and p-channel MOSFETs formed in a major surface of the semiconductor substrate. Each of the n-channel and p-channel MOSFETs include: first, second and third diffused regions which are formed in the major surface and substantially equal in width to each other. The first diffused region is spaced from the second diffused region by a predetermined distance to form a first channel region. The third diffused region is spaced from the second diffused region by a predetermined distance to form a second channel region. A first gate electrode placed on a gate insulating layer overlaying the first channel region, and a second gate electrode is interconnected in common to the first gate electrode and placed on a gate insulating layer overlaying the second channel region. The first gate electrode has an end portion extending over a first part of the second diffused region by a predetermined length. The second gate electrode has an end portion extending over a second part, opposite to the first part, of the second diffused region by a predetermined length.

In accordance with the present invention, there is also provided a sample and hold circuit having an analog switch including p-channel and n-channel MOSFETs which have source-to-drain paths connected in parallel to each other to form a common output port and a common input port of the analog switch. An inverter is connected between gates of the p-channel and n-channel MOSFETs; and a capacitor is connected to the output port. The p-channel MOSFET includes first diffused region formed in a major surface of a semiconductor substrate, and second and third diffused regions formed in the major surface and placed symmetrically to each other with respect to the first diffused region. The second and third diffused regions are substantially equal in width to the first diffused region. A first gate insulating layer covers part of the major surface between the first and second diffused regions; a second gate insulating layer covers part of the major surface between the first and third diffused regions. The first and second gate electrodes formed on said first and second gate insulating layers, respectively, to be interconnected to an output of the inverter. The first gate electrode has an end portion extending over part of the first diffused region by a predetermined length, and second gate electrode has an end portion extending over another part of the first diffused region by a predetermined length. The n-channel MOSFET includes a fourth diffused region formed in the major surface, and fifth and sixth diffused regions formed in the major surface and placed symmetrically to each other with respect to the fourth diffused region. The fifth and sixth diffused regions are substantially equal in width to the fourth diffused region. A third gate insulating layer covers part of the major surface between the fourth and fifth diffused regions, and fourth gate insulating layer covers part of the major surface between the fourth and sixth diffused regions. The third and fourth gate electrodes formed on the third and fourth gate insulating layers, respectively, to be interconnected to an input of the inverter. The third gate electrode has an end portion extending over part of the fourth diffused region by a predetermined length, and the fourth gate electrode has an end portion extending over another part of the fourth diffused region by a predetermined length.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 2:
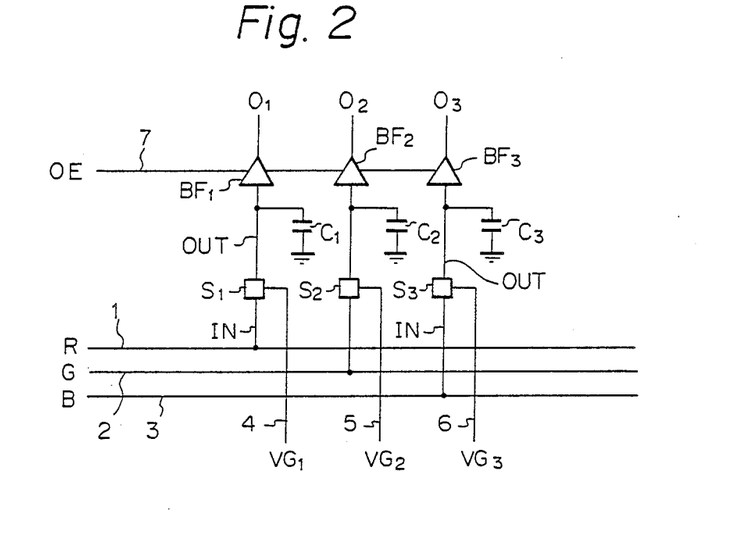
FIG. 2 is a schematic block diagram exemplarily showing a display driver to which analog switches in accordance with the present invention are applied.

Referring to FIG. 2 of the drawings, an arrangement for driving an active matrix liquid display is shown which includes analog switches $S_1$, $S_2$ and $S_3$ in accordance with the present invention. The liquid display driver drives an active matrix liquid crystal display device, not shown, by sampling and holding color component signals R, G and by B of a color TV video signal which respectively arrive at signal lines 1, 2 and 3 and producing outputs $O_1$, $O_2$ and $O_3$ which are respectively associated with the component signals R, G and B. More specifically, the R, G and B signals of a color TV video signal coming in through the signal lines 1, 2 and 3 as mentioned above are respectively sampled by the analog or CMOS switches $S_1$, $S_2$ and $S_3$ in response to gate control signals $VG_1$, $VG_2$ and $VG_3$ which are supplied over signal gate control lines 4, 5 and 6, respectively. The sampled color component signals R, G and B are stored as charges in capacitors $C_1$, $C_2$ and $C_3$ which are associated with the analog switches $S_1$, $S_2$ and $S_3$, respectively. Afterwards, the charges stored in the capacitors $C_1$, $C_2$ and $C_3$ are respectively read out via buffer amplifiers $BF_1$, $BF_2$ and $BF_3$ in response to a control signal OE and fed out via the outputs $O_1$, $O_2$ and $O_3$ as signals for driving the liquid crystal display device.

The signal lines 1, 2 and 3 are connected to the analog switches $S_1$, $S_2$ and $S_3$, respectively. The gate control signals $VG_1$, $VG_2$ and $VG_3$ are respectively applied to the analog switches $S_1$, $S_2$ and $S_3$ via the gate control lines 4, 5 and 6, as previously stated. For example, when the gate control signal $G_1$ on the gate control line 4 has a (logical) high level, the analog switch $S_1$ is turned on so that the color component signal R coming in over the signal line 1 charges the capacitor $C_1$. Likewise, when any of the other gate control signals $VG_2$ and $VG_3$ appearing on the gate control lines 5 and 6 has a high level, the capacitor $C_2$ or $C_3$ is charged in association with the color component signal G or B via the analog switch $S_2$ or $S_3$. When the control signal OE which appears on a control line 7 becomes a high level after the capacitors $C_1$, $C_2$ and $C_3$ have been individually charged by the analog signals R, G and B, i.e., after the R, G and B signals have been sampled and held, voltages associated with the charges in the capacitors $C_1$, $C_2$ and $C_3$ are respectively fed out via the buffer amplifiers $BF_1$, $BF_2$ and $BF_3$ and outputs $O_1$, $O_2$ and $O_3$ to those lines which are connected to columns of the display segments of the active matrix display device. As a result, display cells of the display device are individually energized to produce a display which is associated with the color component signals R, G and B.

Figure 3:
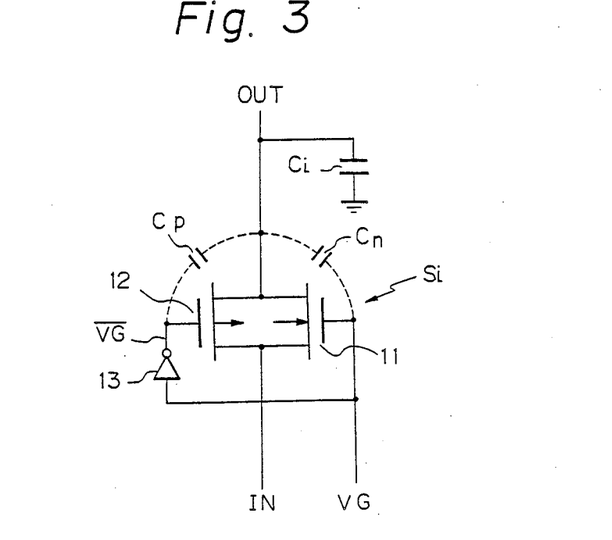
FIG. 3 is a schematic diagram exemplarily showing a sample and hold circuit which is included in the display driver of FIG. 2.

FIG. 3 is a diagram more specifically showing a sample and hold circuit constituted by the i-th analog switch $S_i$ and the i-th capacitor $C_i$ (i=1, 2, 3 ...) which are included in the display driver of FIG. 2. As shown, the analog switch $S_i$ is implemented as a parallel connection of an n-channel MOSFET 11 and a p-channel MOSFET 12 having source-to-drain paths which are connected in parallel as depicted. One of the sources and the drains of the n-channel and p-channel MOSFETs 11 and 12 is commonly connected to an output terminal OUT of the sample and hold circuit while the other is commonly connected to an input terminal IN. The output terminal OUT is connected to one plate of a capacitor $C_i$ and a buffer, $BF_i$, the other plate of the capacitor $C_i$ being connected to ground. The input terminal IN is connected to one of the signal lines 1, 2 and 3 which is associated with the sample and hold circuit. The p-channel FET 12 and the n-channel FET 11 have gate electrodes connecting to an associated one of the gate control lines, such as lines 4, 5 and 6, via an inverter 13 and directly, respectively.

Figures 4A, 4B:
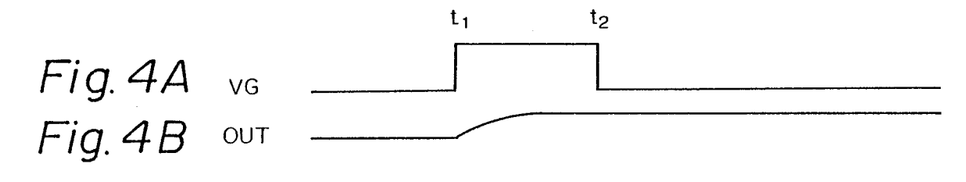
FIG. 4 is a timing chart useful for understanding the operation of the sample and hold circuit as shown in FIG. 3.

In operation, when the gate control signal VG, as shown in FIG. 4A, of the gate control line becomes a high level, the n-channel MOSFET 11 is turned on. Then, a gate control signal $\overline{VG}$ having a (logical) low level is applied to the gate electrode of the p-channel MOSFET 12 via the inverter 13 with the result being that the FET 12 is also turned on. Consequently, the signal (IN) inputted to the commonly connected drains of the FETs 11 and 12 is outputted from the commonly connected sources to the capacitor $C_i$, as shown in FIG. 4B.

Figure 4C:
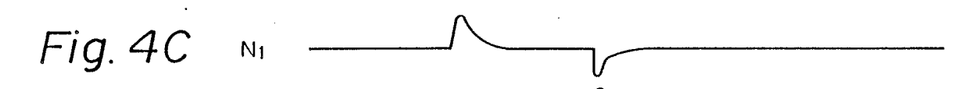
Figure 4D:
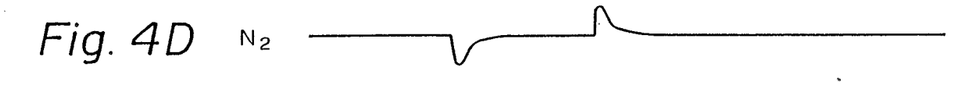

A gate capacitance $C_n$ and a gate capacitance $C_p$ exist between the gate electrode and the output, or source, of the n-channel MOSFET 11 and between the gate electrode and the output, or source, of the p-channel MOSFET 12, respectively. In this condition, when a gate control signal is applied to the gate electrodes of the FETs 11 and 12, noise $N_1$, as shown in FIG. 4C, and noise $N_2$, as shown in FIG. 4D, are superposed on an output OUT through the gate capacitances $C_n$ and $C_p$, respectively. So long as the gate capacitances $C_n$ and $C_p$ are substantially equal to each other, the noises $N_1$ and $N_2$ cancel each other because they are opposite in phase and equal in level.

To promote a better understanding of the present invention, a prior art construction applied to the analog switch $S_i$ will be described with reference to FIG. 5. As shown, diffused regions 21 and 22 of an n-type impurity are deposited on a major surface of a semiconductor substrate 20 such that one of them constitutes a drain and the other constitutes a source. Provided on the surface of the substrate 20 between the diffused regions 21 and 22 is a gate electrode layer 23. The diffused regions 21 and 22 are respectively connected to an input electrode conductor 24 and an output electrode conductor 25 by contact pads 26 and 27. The gate electrode layer 23 covers or overlaps the diffused region 22 by a length $L_n$, and it is this overlapping length $L_n$ that determines the value of the gate capacitance $C_n$. A gate region 28 is defined beneath the gate electrode 23. The regions described so far constitute the n-channel MOSFET 11 in cooperation.

Also deposited on the semiconductor substrate 20 are diffused regions 31 and 32 of a p-type impurity and a gate electrode layer 33 which intervenes between the diffused regions 31 and 32. The diffused regions 31 and 32 are respectively connected to the electrode conductors 24 and 25 by contact pads 34 and 35. The gate electrode layer 33 covers or overlaps the diffused region 32 by a length $L_p$. This overlapping length $L_p$ determines the previously mentioned gate capacitance $C_p$. A gate region 36 is defined beneath the gate electrode 33. The regions stated above in combination constitute the p-channel FET 12.

Figure 5:
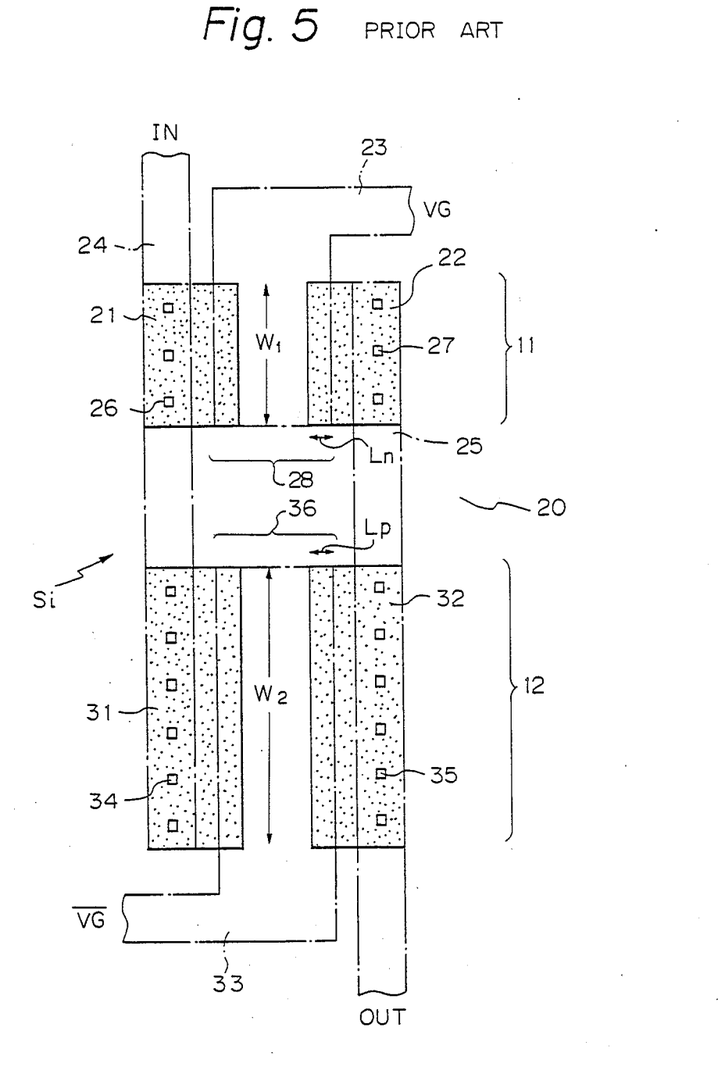
FIG. 5 is a plan view exemplarily showing a prior art analog switch.

As shown in FIG. 5, the n-channel MOSFET 11 and the p-channel MOSFET 12 of the prior art analog switch are configured such that their gate electrodes 23 and 33 have widths $W_1$ and $W_2$, respectively, which are different from each other. This brings about a problem in that although the gate overlapping lengths $L_n$ and $L_p$ of the FETs 11 and 12 may be designed equal, the gate capacitances $C_n$ and $C_p$ are different from each other thereby causing noises ascribable to those gate capacitances to appear in an output.

Another drawback with the prior art analog switch is that when a mask for defining the n-type diffused regions 21 and 22, a mask for defining the p-type diffused regions 31 and 32 and a mask for defining the electrode layers 23 and 33 are dislocated relative to each other at the fabrication stage, the gate overlapping lengths $L_n$ and $L_p$ cannot be maintained constant throughout the lots. Scattering of the overlapping lengths $L_n$ and $L_p$ causes the voltage sampled and held and then outputted to vary from one product to another even if the voltage applied to the individual products may be the same.

Figure 1:
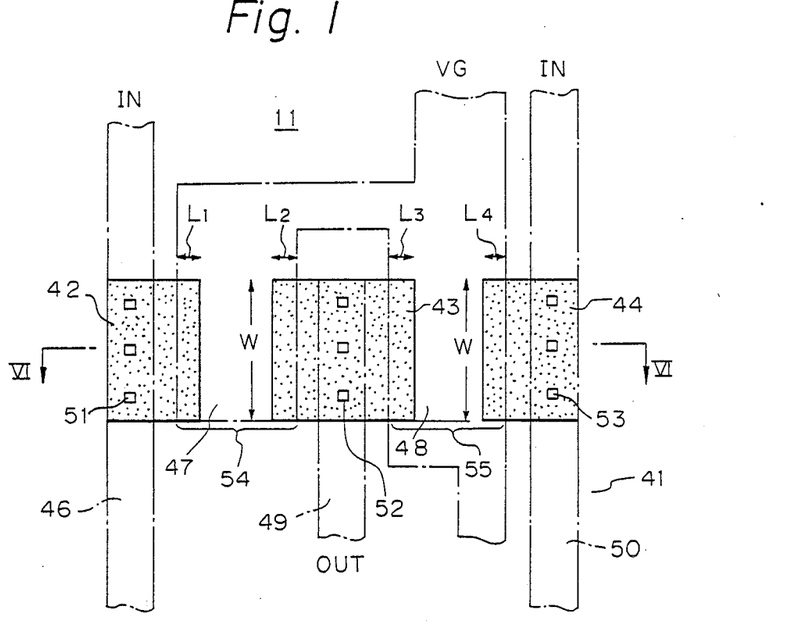
FIG. 1 is a plan view schematically showing an embodiment of an n-channel MOSFET included in an analog switch in accordance with the present invention.
Figure 6:
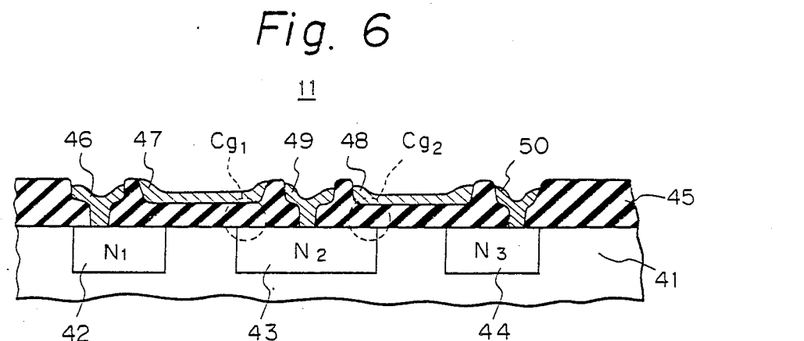
FIG. 6 is a cross-sectional view taken along line VI—VI of FIG. 1.

Referring to FIG. 1, there is shown a basic structure of the n-channel MOSFET 11 which is applicable to the analog switches $S_1$, $S_2$ and $S_3$ in accordance with the present invention. FIG. 6 is a section along line VI—VI of FIG. 1. It is to be noted that FIG. 1 indicates a part of the layers by phantom lines to avoid intricacy of illustration while FIG. 6 shows only those structural parts which are essential to the understanding of the present invention.

In FIGS. 1 and 6, the n-channel MOSFET 11 includes a semiconductor substrate 41 on one major surface of which diffused regions 42, 43 and 44 of a n-type impurity are deposited. The diffused regions 42 and 44 are positioned in line symmetry to each other at the left-hand side and the right-hand side of the intermediate diffused region 43 as viewed in the figures. An insulating layer 45 is made of an oxide such as $SiO_2$ and formed on the major surface of the substrate 41. Electrode layers 46, 47, 48, 49 and 50 made of a metal such as aluminum are deposited on the insulating layer 45. The electrode layers 46 and 50 adapted for input are respectively connected to the diffused regions 42 and 44 by contact pads 51 and 53. The gate electrode layer 47 extends between and over the diffused regions 42 and 43 while the gate electrode layer 48 extends between and over the diffused regions 43 and 44. In this configuration, gates 54 and 55 are defined beneath the gate electrode layers 47 and 48, respectively. As shown, the gate electrode layers 47 and 48 are connected commonly to each other. Likewise, the electrode layers 46 and 50 are commonly connected commonly to each other at a particular location not shown. Hence, when the diffused region 43 constitutes a drain (or a source), the diffused regions 42 and 44 each constitutes a source (or a drain). It follows that the diffused regions 42 and 43 and gate electrode layer 47 form a first MOSFET and the diffused regions 43 and 44 and gate electrode layer 48 form a second MOSFET, the two FETs being connected in parallel by the electrodes layers 46, 49 and 50 to constitute the n-channel FET 11. In order to isolate the n-channel MOSFET 11 electrically from other functions on the semiconductor substrate 41, the n-channel MOSFET 11 may advantageously be formed in a p-well 90 (see FIG. 9, in which the insulative layers are not shown for simplicity), which is established in the major surface of the substrate 41 by diffusing a p-type impurity.

As shown in FIG. 1, the gate electrode 47 covers or overlaps a part of the diffused region 42 and a part of the diffused region 43 by lengths $L_1$ and $L_2$, respectively. Likewise, the gate electrode 48 covers or overlaps a part of the diffused region 43 and a part of the diffused region 44 by lengths $L_3$ and $L_4$, respectively. It is noteworthy that the two gates 54 and 55 have the same width W. The length $L_2$ by which the gate electrode 47 overlaps the diffused region 43 determines the gate capacitance $C_{g1}$ of the first FET, and the length $L_3$ by which the gate electrode layer 48 overlaps the diffused region 43 determines the gate capacitance $C_{g2}$ of the second FET.

Assume that during fabrication a mask for forming the gate electrode layers 47 and 48 and a mask for forming the diffused region 43 are dislocated in the lateral direction viewed in FIG. 1 to increase (or decrease) the overlapping length $L_2$. Then, the overlapping length $L_3$ decreases (or increases) in inverse proportion to the overlapping length $L_2$. Such a relationship may be expressed as:

$$L_2 + L_3 = L_0$$

where $L_0$ is constant.

Since the first and second FETs have the same gate width W, the gate capacitances of the FETs which are connected in parallel are equal to the previously discussed $C_n$, i.e., $$C_{g1} + C_{g2} = C_n.$$

Since $C_n$ is constant, the gate capacitance $C_n$ is prevented from differing from one lot to another at the time of fabrication.

Figure 7:
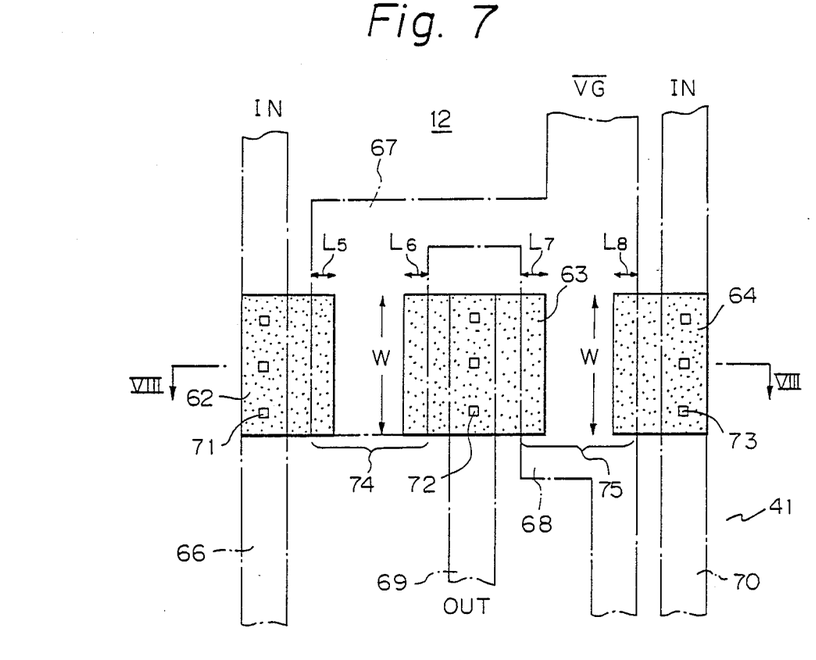
FIG. 7 is a plan view showing an embodiment of a p-channel MOSFET which is also included in the analog switch in accordance with the present invention.
Figure 8:
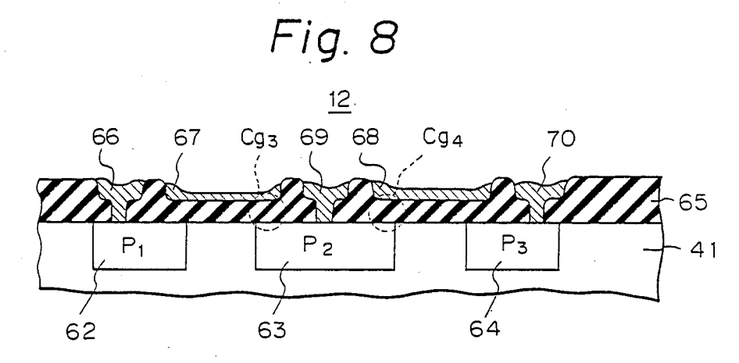
FIG. 8 is a cross-sectional view taken along line VIII—VIII of FIG. 7.

Referring to FIG. 7, the p-channel MOSFET 12 applicable to the analog switch $S_i$ of FIG. 3 is shown in a plan view. FIG. 8 is a cross-sectional view taken along line VIII—VIII of FIG. 7. In this particular embodiment, diffused regions of a p-type impurity 62, 63 and 64 are provided on the major surface of the semiconductor substrate 41 which is shared by the n-channel FET 11. The basic structure of the p-channel FET 12 is similar to that of the n-channel FET 11 and, therefore, will not be described in detail to avoid redundancy.

Figure 9:
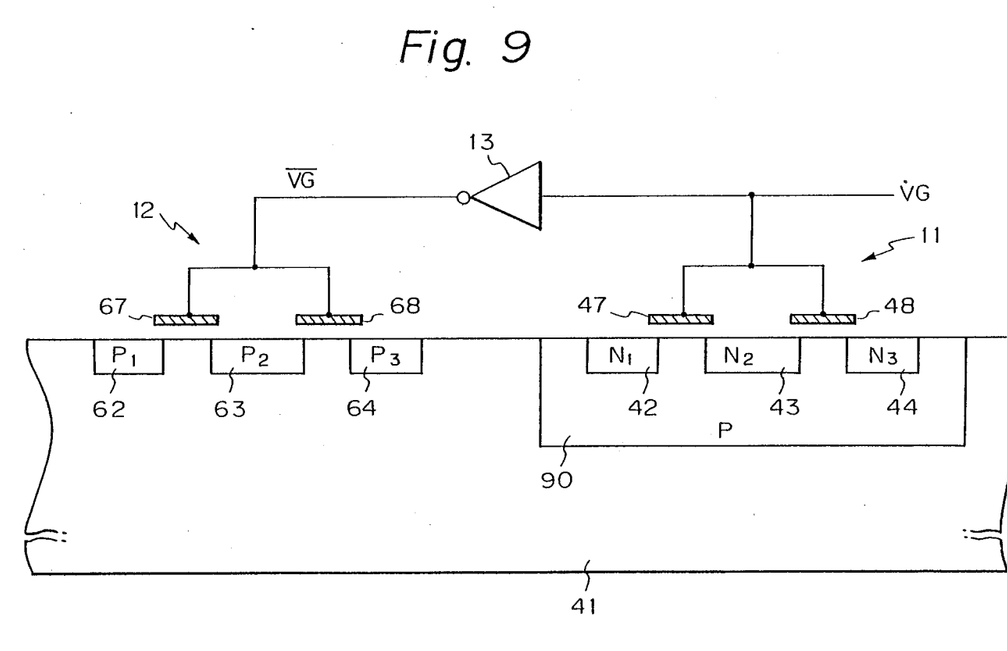
FIG. 9 schematically shows a sectional structure, partially with circuit connections, including the n-channel and p-channel MOSFETs formed on a semiconductor substrate in accordance with the embodiment shown in FIG. 3.

In FIGS. 7 and 8, an electrode layer 66 is connected to the p-type diffused region 62 by contact pads 71 and, at a particular position not shown, to an electrode layer 70 which is connected to the p-type diffused region 64 by contact pads 73. Further, the electrode layers 66 and 70 are respectively connected to the electrode layers 46 and 50 of the n-channel FET 11. An electrode layer 69 is connected to the p-type diffused region 63 by contact pads 72 and to the electrode layer 49 of the n-channel FET 11. This implements the parallel connection of the source-to-drain paths of the p-channel and n-channel FETs 11 and 12. Gate electrode layers 67 and 68 of the p-channel MOSFET 12 are also commonly connected as depicted so that the gate control signal $\overline{VG}$ may be received via the inverter 13. Likewise, the gate electrode layers 47 and 48 of the n-channel FET 11 are so connected as to receive the gate control signal VG. Those circuit connections are also shown in FIG. 9. The structure shown and described constitutes the analog switch $S_i$ which is constructed as shown in FIG. 3.

As shown in FIG. 7, gates 74 and 75 are defined beneath the gate electrode layers 67 and 68, respectively. The gates 74 and 75 include those regions which are associated with overlapping lengths $L_5$, $L_6$, $L_7$ and $L_8$. The overlapping lengths $L_6$ and $L_7$ are related with each other in the same manner as discussed earlier in relation to the n-channel FET 11, i.e., the sum of the lengths $L_6$ and $L_7$ is constant. Hence, the sum of gate capacitances $C_{g3}$ and $C_{g4}$ created by the overlapping $L_6$ and $L_7$ is substantially equal to the gate capacitance $C_p$ of the p-channel MOSFET 12 and is constant. While the n-channel and p-channel FETs 11 and 12 have been shown and described as having the same gate width W, the FETs 11 and 12 may be provided with different widths W and different overlapping lengths $L_2$ and $L_3$ and $L_6$ and $L_7$ on condition that the gate capacitances $C_n$ and $C_p$ of the FETs 11 and 12 are substantially the same. However, providing the FETs 11 and 12 with the same gate width W and the overlapping lengths $L_2$ and $L_3$ and $L_6$ and $L_7$ is advantageous because the gate capacitances $C_n$ and $C_p$ will then be constantly balanced with each other even if the masks are dislocated during fabrication of the device. Hence, the noises $N_1$ and $N_2$ appearing on the output OUT via the gate capacitances $C_n$ and $C_p$ due to the gate control signal BG are substantially the same in level and opposite in polarity. It follows that the noises ascribable to the gate capacitances cancel each other at the output OUT of the analog switch $S_i$.

In an alternative embodiment in which the gate width W is different between the n-channel and p-channel MOSFETs 11 and 12, it is advantageous, in terms of minimizing the unbalance of the gate capacitance therebetween due to misalignment of the masks during the fabrication process, to design the gate insulator layers so differently in thickness between the n-channel and p-channel FETs 11 and 12 as to provide substantially the same gate capacitance therebetween with the sum of overlapping lengths $L_2$ and $L_3$ substantially equal to that of overlapping lengths $L_6$ and $L_7$.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A semiconductor device comprising:
   a semiconductor substrate having a surface;
   an n-channel MOSFET device and a p-channel MOSFET device formed at said surface of said semiconductor substrate;
   each of said n-channel MOSFET device and p-channel MOSFET device comprising:
   first, second and third diffused regions formed in said surface of said semiconductor substrate and arranged in a line in a first direction, each of said first, second and third diffused regions having opposite side portions extending substantially parallel to each other in a second direction perpendicular to said first direction, and each having substantially a same width extending along said opposite side portions in said second direction;
   said first diffused region being spaced from said second diffused region by a first distance to form a first channel region therebetween;
   said second diffused region being spaced from said third diffused region by a second distance to form a second channel region therebetween;
   a first gate electrode formed along a surface of a first gate insulating layer overlaying said first channel region, said first gate electrode having opposite side portions extending parallel to each other in said second direction;
   a second gate electrode electrically connected to said first gate electrode and formed along a surface of a second gate insulating layer overlaying said second channel region, said second gate electrode having opposite side portions extending parallel to each other in said second direction;
   wherein one of said opposite side portions of said first gate electrode extends over one of said opposite side portions of said second diffused region by a third distance in said first direction, and wherein one of said opposite side portions of said second gate electrode extends over the other of said opposite side portions of said second diffused region by a fourth distance in said first direction;
   wherein a length defined by the sum of said third and fourth distances is substantially a same for each of said n-channel MOSFET device and p-channel MOSFET device.

2. A semiconductor device as recited in claim 1, wherein said first distance and said second distance are substantially the same, and wherein said first diffused region and said third diffused region extend in a same length along said first direction.

3. A semiconductor device as recited in claim 1, wherein said second diffused regions of said p-channel MOSFET device and said n-channel MOSFET device are drain regions, and said first and third diffused regions of said p-channel MOSFET device and said n-channel MOSFET device are electrically connected and are source regions.

4. A semiconductor device as recited in claim 2, wherein said second diffused regions of said p-channel MOSFET device and said n-channel MOSFET device are drain regions, and said first and third diffused regions of said p-channel MOSFET device and said n-channel MOSFET device are electrically connected and are source regions.

5. A semiconductor device are recited in claim 1, further comprising a p-well region formed in said surface of said semiconductor substrate, said n-channel MOSFET device being formed in said p-well region.

6. A semiconductor device are recited in claim 2, further comprising a p-well region formed in said surface of said semiconductor substrate, said n-channel MOSFET device being formed in said p-well region.

7. A semiconductor device are recited in claim 3, further comprising a p-well region formed in said surface of said semiconductor substrate, said n-channel MOSFET device being formed in said p-well region.

8. A semiconductor device are recited in claim 4, further comprising a p-well region formed in said surface of said semiconductor substrate, said n-channel MOSFET device being formed in said p-well region.

9. An analog switch comprising:
a semiconductor substrate having a surface;
a p-channel MOSFET device formed at the surface of said semiconductor substrate and having a first electrode, a second electrode, and a first gate electrode; and
an n-channel MOSFET device formed at the surface of said semiconductor substrate and having a third electrode, a fourth electrode, and a second gate electrode;
wherein one of said first and second electrodes is electrically connected to one of said third and fourth electrodes, and the other of said first and second electrodes is electrically connected to the other of said third and fourth electrodes;
said p-channel MOSFET device comprising:
(a) first, second and third p-diffused regions formed of a p-type impurity in said surface of said semiconductor substrate and arranged in a line in a first direction, each of said first, second and third p-diffused regions having opposite side portions extending substantially parallel to each other in a second direction perpendicular to said first direction, and each having substantially a same width extending along said opposite side portions in said second direction, said first p-diffused region being spaced from said second p-diffused region by a first distance to form a first channel region therebetween, said second p-diffused region being spaced from said third p-diffused region by a second distance to form a second channel region therebetween;
(b) first, second and third electrode layers respectively connected to said first, second and third p-diffused regions, said first electrode layer being interconnected to said third electrode layer to form one of said first and second electrodes, said second electrode layer forming the other of said first and second electrodes;
(c) a first gate electrode layer formed along a surface of a first gate insulating layer overlaying said first channel region, said first gate electrode layer having opposite side portions extending parallel to each other in said first direction;
(d) a second gate electrode layer electrically connected to said first gate electrode layer to obtain said first gate electrode and formed along a surface of a second gate insulating layer overlaying said second channel region, said second gate electrode layer having opposite side portions extending substantially parallel to each other in said second direction; wherein one of said opposite side portions of said first gate electrode layer extends over one of said opposite side portions of said second p-diffused region by a third distance in said first direction, and wherein the other of said opposite side portions of said first gate electrode layer extends over one of said opposite side portions of said first p-diffused region by a ninth distance in said first direction, and wherein one of said opposite side portions of said second gate electrode layer extends over the other of said opposite side portions of said second p-diffused region by a fourth distance in said first direction, and wherein the other of said opposite side portions of said second gate electrode layer extends over one of said opposite side portions of said third p-diffused region by a tenth distance in said first direction;
said n-channel MOSFET device comprising:
(a) first, second and third n-diffused regions formed of an n-type impurity in said surface of said semiconductor substrate and arranged in a line in a third direction, each of said first, second and third n-diffused regions having opposite side portions extending substantially parallel to each other in a fourth direction perpendicular to said third direction, and each having substantially a same width extending along said opposite side portions in said fourth direction, said first n-diffused region being spaced from said second n-diffused region by a fifth distance to form a third channel region therebetween, said second n-diffused region being spaced from said third n-diffused region by a sixth distance to form a fourth channel region therebetween;
(b) fourth, fifth and sixth electrode layers respectively connected to said first, second and third n-diffused regions, said fourth electrode layer being interconnected to said sixth electrode layer to form one of said third and fourth electrodes, said fifth electrode layer forming the other of said third and fourth electrodes;
(c) a third gate electrode layer formed along a surface of a third gate insulating layer overlaying said third channel region, said third gate electrode layer having opposite side portions extending parallel to each other in said fourth direction;
(d) a fourth gate electrode layer electrically connected to said third gate electrode layer to obtain said second gate electrode and formed along a surface of a fourth gate insulating layer overlaying said fourth channel region, said fourth gate electrode layer having opposite side portions extending parallel to each other in said fourth direction; wherein one of said opposite side portions of said third gate electrode layer extends over one of said opposite side portions of second n-diffused region by a seventh distance in said third direction, and wherein the other of said opposite side portions of said third gate electrode layer extends over one of said opposite side portions of said first n-diffused region by an eleventh distance in said third direction, and wherein one of said opposite side portions of said fourth gate electrode layer extends over the other of said opposite side portions of said second n-diffused region by an eighth distance in said third direction, and wherein the other of said opposite side portions of said fourth gate electrode layer extends over one of said opposite side portions of said third n-diffused region by a twelfth distance in said third direction;

wherein, upon a displacement in said first direction of said first and second gate electrode layers, at least one of a sum of said third distance and said fourth distance and a sum of said ninth distance and said tenth distance remains substantially constant;

wherein, upon a displacement in said third direction of said third and fourth gate electrode layers, at least one of a sum of said seventh distance and said eighth distance and a sum of said eleventh distance and said twelfth distance remains substantially constant.

10. An analog switch as recited in claim 9, wherein said first, second, fifth and sixth distances are substantially the same.

11. An analog switch as recited in claim 9, wherein said first and second gate electrode layers are formed by a common mask for patterning said first and second gate electrode layers onto said surface of said semiconductor substrate, and said third and fourth gate electrode layers are formed by a common mask for patterning said third and fourth gate electrode layers onto said surface of said semiconductor substrate.

12. An analog switch as recited in claim 9, wherein said first, third, fourth and sixth electrode layers are interconnected in common, and said second and fifth electrode layers are interconnected in common.

13. An analog switch as recited in claim 9, wherein said first, third, fourth and sixth electrode layers form an input port of said analog switch, and said second and fifth electrode layers form an output port of said analog switch.

14. A sample and hold circuit comprising:
an analog switch including: a semiconductor substrate having a surface; a p-channel MOSFET device formed at said surface of said semiconductor substrate and having a first electrode, a second electrode, and a first gate electrode; and; an n-channel MOSFET device formed at said surface of said semiconductor substrate and having a third electrode, a fourth electrode, and a second gate electrode; wherein one of said first and second electrodes is electrically connected to one of said third and fourth electrodes to form an output port, and wherein the other of said first and second electrodes is electrically connected to the other of said third and fourth electrodes to form an input port;
an inverter connected between said first and second gate electrodes; and,
a capacitor device connected to said output port;
said p-channel MOSFET device comprising:
(a) first, second and third p-diffused regions formed of a p-type impurity in said surface of said semiconductor substrate and arranged in a line in a first direction, each of said first, second and third p-diffused regions having opposite side portions extending substantially parallel to each other in a second direction perpendicular said first direction, and each having substantially a same width extending along said opposite side portions in said second direction, said first p-diffused region being spaced from said second p-diffused region by a first distance to form a first channel region therebetween, said second p-diffused region being spaced from said third p-diffused region by a second distance to form a second channel region therebetween;

(b) first, second and third electrode layers respectively connected to said first, second and third p-diffused regions, said first electrode layer being interconnected to said third electrode layer to form one of said first and second electrodes, said second electrode layer forming the other of said first and second electrodes;

(c) a first gate electrode layer formed along a surface of a first gate insulating layer overlaying said first channel region, said first gate electrode layer having opposite side portions extending parallel to each other in said second direction;

(d) a second gate electrode layer electrically connected to said first gate electrode layer to obtain said first gate electrode and formed along a surface of a second gate insulating layer overlaying said second channel region, said second gate electrode layer having opposite side portions extending substantially parallel to each other in said second direction; wherein one of said opposite side portions of said first gate electrode layer extends over one of said opposite side portions of second p-diffused region by a third distance in said first direction, and wherein the other of said opposite side portions of said first gate electrode layer extends over one of said opposite side portions of said first p-diffused region by a ninth distance in said first direction, and wherein one of said opposite side portions of said second gate electrode layer extends over the other of said opposite side portions of said second p-diffused region by a fourth distance in said first direction, and wherein the other of said opposite side portions of said second gate electrode layer extends over one of said opposite side portions of said third p-diffused region by a tenth distance in said first direction;

said n-channel MOSFET device comprising:
(a) first, second and third n-diffused regions formed of an n-type impurity in said surface of said semiconductor substrate and arranged in a line in a third direction, each of said first, second and third n-diffused regions having opposite side portions extending substantially parallel to each other in a fourth direction perpendicular to said third direction, and each having substantially a same width extending along said opposite side portions in said fourth direction, said first n-diffused region being spaced from said second n-diffused region by a fifth distance to form a third channel region therebetween, said second n-diffused region being spaced from said third n-diffused region by a sixth distance to form a fourth channel region therebetween;

(b) fourth, fifth and sixth electrode layers respectively connected to said first, second and third n-diffused regions, said fourth electrode layer being interconnected to said sixth electrode layer to form one of said third and fourth electrodes, said fifth electrode layer forming the other of said third and fourth electrodes;

(c) a third gate electrode layer formed along a surface of a third gate insulating layer overlaying said third channel region, said third gate electrode layer having opposite side portions extending parallel to each other in said fourth direction;

(d) a fourth gate electrode layer electrically connected to said third gate electrode layer to obtain said second gate electrode and formed along a surface of a fourth gate insulating layer overlaying said fourth channel region, said fourth gate electrode layer having opposite side portions extending parallel to each other in said fourth direction; wherein one of said opposite side portions of said third gate electrode layer extends over one of said opposite side portions of said second n-diffused region by a seventh distance in said third direction, and wherein the other of said opposite side portions of said third gate electrode layer extends over one of said opposite side portions of said first n-diffused region by an eleventh distance in said third direction, and wherein one of said opposite side portions of said fourth gate electrode layer extends over the other of said opposite side portions of said second n-diffused region by an eighth distance in said third direction, and wherein the other of said opposite side portions of said fourth gate electrode layer extend over one of said opposite side portions of said third n-diffused region by a twelfth distance in said third direction;

wherein, upon a displacement in said first direction of said first and second gate electrode layers, at least one of a sum of said third distance and said fourth distance and a sum of said ninth distance and said tenth distance remains substantially constant;

wherein, upon a displacement in said third direction of said third and fourth gate electrode layers, at least one of a sum of said seventh distance and said eighth distance and a sum of said eleventh distance and said twelfth distance remains substantially constant.

15. A sample and hold circuit as recited in claim 14, wherein said first and second gate electrode layers are formed by a common mask for patterning said first and second gate electrode layers onto said surface of said semiconductor substrate, and said third and fourth gate electrode layers are formed by a common mask for patterning said third and fourth gate electrode layers onto said surface of said semiconductor substrate.

* * * * *

UNITED STATES PATENT AND TRADEMARK OFFICE
CERTIFICATE OF CORRECTION

PATENT NO. : 4,962,413

DATED : October 9, 1990

INVENTOR(S) : Seiichi YAMAZAKI et al.

It is certified that error appears in the above-identified patent and that said Letters Patent is hereby corrected as shown below:

Title page:

Item [75], line 2, change "Hiroshisa" to -- Hirohisa --.

Signed and Sealed this

Thirty-first Day of March, 1992

Attest:

HARRY F. MANBECK, JR.

*Attesting Officer*      *Commissioner of Patents and Trademarks*